(12) United States Patent
Kuo et al.

(10) Patent No.: US 7,193,304 B2
(45) Date of Patent: Mar. 20, 2007

(54) MEMORY CARD STRUCTURE

(75) Inventors: Cheng-Hsien Kuo, Taipei Hsien (TW); Ming-Jhy Jiang, Taipei (TW); Cheng-Kang Yu, Taipei County (TW); Hui-Chuan Chuang, Tainan County (TW)

(73) Assignee: Advanced Flash Memory Card Technology Co., Ltd., Taipei Hsieng (TW)

( * ) Notice: Subject to any disclaimer, the term of this patent is extended or adjusted under 35 U.S.C. 154(b) by 0 days.

(21) Appl. No.: 10/904,976

(22) Filed: Dec. 8, 2004

(65) Prior Publication Data

US 2006/0076662 A1 Apr. 13, 2006

(30) Foreign Application Priority Data

Oct. 7, 2004 (TW) .............................. 93130325 A

(51) Int. Cl.
*H01L 21/44* (2006.01)

(52) U.S. Cl. ...................................... 257/679; 257/678

(58) Field of Classification Search ................ 257/679, 257/777, 778, E27.137, E27.144, E27.161, 257/E23.169, 678
See application file for complete search history.

(56) References Cited

U.S. PATENT DOCUMENTS

| | | | | |
|---|---|---|---|---|
| 4,750,092 A * | 6/1988 | Werther | ...................... | 361/783 |
| 5,729,050 A * | 3/1998 | Kim | ........................... | 257/667 |
| 5,796,165 A * | 8/1998 | Yoshikawa et al. | ......... | 257/728 |
| 5,814,883 A * | 9/1998 | Sawai et al. | ................. | 257/712 |
| 6,414,849 B1 * | 7/2002 | Chiu | ........................... | 361/760 |
| 6,492,203 B1 * | 12/2002 | Wakashima et al. | ........ | 438/127 |
| 6,492,717 B1 * | 12/2002 | Gore et al. | ................. | 257/679 |
| 6,624,523 B2 * | 9/2003 | Chao et al. | ................. | 257/796 |
| 6,838,313 B2 * | 1/2005 | Kumamoto et al. | ........ | 438/106 |
| 2001/0026013 A1 * | 10/2001 | Mess et al. | ................. | 257/686 |
| 2003/0025199 A1 * | 2/2003 | Wu et al. | .................... | 257/724 |
| 2003/0042587 A1 * | 3/2003 | Lee | ............................. | 257/678 |
| 2003/0057544 A1 * | 3/2003 | Nathan et al. | .............. | 257/700 |
| 2003/0057563 A1 * | 3/2003 | Nathan et al. | .............. | 257/777 |
| 2003/0059976 A1 * | 3/2003 | Nathan et al. | .............. | 438/106 |
| 2003/0148597 A1 * | 8/2003 | Tan et al. | ................... | 438/612 |
| 2004/0056104 A1 * | 3/2004 | Osawa et al. | ............... | 235/492 |

* cited by examiner

*Primary Examiner*—Thao P. Le
(74) *Attorney, Agent, or Firm*—Jianq Chyun IP Office

(57) ABSTRACT

A memory card structure comprising a substrate, a plurality of memory chips, some molding compound and an ultra-thin plastic shell is provided. To fabricate the memory card, a substrate having a first surface and a second surface is provided. The first surface has a plurality of outer contacts and the second surface has a cavity and a plurality of inner contacts around the cavity. The outer contacts and the inner contacts are electrically connected to each other. The memory chips are stacked up in the same area inside the cavity. Furthermore, the memory chips are electrically connected to the inner contacts. Then, the memory chips and the inner contacts are encapsulated. Thereafter, the ultra-thin plastic shell is placed over the second surface and attached to the substrate. That portion of the ultra-thin plastic shell covering the memory chips has a thickness of about 0.1~0.4 mm.

7 Claims, 4 Drawing Sheets

MEMORY CARD STRUCTURE

CROSS-REFERENCE TO RELATED APPLICATION

This application claims the priority benefit of Taiwan application serial no. 931 30325, filed Oct. 7, 2004.

BACKGROUND OF THE INVENTION

1. Field of the Invention

The present invention relates to a memory device and manufacturing method thereof. More particularly, the present invention relates to a memory card structure and manufacturing method thereof.

2. Description of the Related Art

With the rapid advance in integrated circuit fabrication technologies and the many breakthroughs in material engineering in recent years, the size of a chip continues to decrease despite the inclusion of more functions. Many electronic products such as electronic thesauruses, digital cameras and countless other types of digital products routinely deploy at least one integrated circuit chip. As the techniques for fabricating chip packages mature, it is now possible to enclose a single or a multiple of chips inside a thin card so that a large quantity of digital data can be stored in one place. Utilizing the large storage capacity of a data card, a portable memory device that occupies a considerably smaller volume than a conventional magnetic recording medium is produced. In general, this type of electronic storage medium is called a memory card.

FIG. 1 is a schematic cross-sectional view showing the structure of a conventional memory card. As shown in FIG. 1, the memory card 100 comprises a substrate 110, a memory chip 120, some molding compound 130 and a plastic shell 140. The substrate 110 has a first surface 112 and a second surface 114. The first surface 112 has a plurality of outer contacts 116 and the second surface 114 has a plurality of inner contacts 118. The outer contacts 116 and the inner contacts 118 are electrically connected to each other. The memory chip 120 is electrically connected to the inner contacts 118. The molding compound 130 encapsulates the memory chip 120 and the inner contacts 118. The plastic shell 140 is attached to the second surface 114 of the substrate 110 through some thermal plastic glue 142.

However, there is an increase demand for smaller memory units having a larger data storage capacity in recent years. Since the data storage capacity of the conventional memory card can no longer satisfy these demands, there is an urgent need to boost the storage capacity of memory cards.

SUMMARY OF THE INVENTION

Accordingly, at least one objective of the present invention is to provide a memory card structure with a larger data storage capacity.

At least a second objective of the present invention is to provide a method of fabricating a memory card having the aforementioned memory card structure.

To achieve these and other advantages and in accordance with the purpose of the invention, as embodied and broadly described herein, the invention provides a memory card structure. The memory card comprises a substrate, a plurality of memory chips, some molding compound and an ultra-thin plastic shell. The substrate has a first surface and a second surface. The first surface has a plurality of outer contacts and the second surface has at least a cavity. A plurality of inner contacts is disposed around the cavity. The outer contacts and the inner contacts are electrically connected to each other. The memory chips are stacked up together in one area inside the cavity to form a memory chip stack. The memory cards are electrically connected to the inner contacts of the substrate. The memory chips and the inner contacts are encapsulated by the molding compound. The ultra-thin plastic shell is placed on the second surface of the substrate. That portion of the ultra-thin plastic shell covering the memory chips has a thickness of about 0.1~0.4 mm.

According to the memory card structure of the present invention, the body of the ultra-thin plastic shell has a shape that meets the specifications of an xD picture card. Furthermore, the memory chip is electrically connected to the inner contacts through a plurality of conductive wires such as gold wires or aluminum wires. Moreover, neighboring pairs of memory chips are separated from each other through the molding compound.

According to the memory card structure of the present invention, the molding compound comprises epoxy resin or polyimide. In addition, the ultra-thin plastic shell is fabricated using a material selected from a group comprising polycarbonate, polystyrene, acrylonitril butadiene styrene (ABS) resin and other suitable generic engineering plastics.

The present invention also provides a method of fabricating a memory card. First, a substrate having a first surface and a second surface is provided. The first surface has a plurality of outer contacts and the second surface has at least a cavity. A plurality of inner contacts is disposed around the cavity. The outer contacts and the inner contacts are electrically connected to each other. Thereafter, a plurality of memory chips is stacked on top of each other in the same area inside the cavity to form a memory chip stack and electrically connected to corresponding inner contacts. A molding process is carried out to encapsulate the memory chips and the inner contacts with a molding compound. Then, an ultra-thin plastic shell is placed on the second surface and bonded to the substrate. The ultra-thin plastic shell has a thickness of about 0.1~0.4 mm in areas over the memory chips to reserve more space for housing the memory chip stack.

According to the aforementioned method of fabricating the memory card, the memory card formed after joining the ultra-thin plastic shell and the substrate together has a body that meets the specification of an xD picture card. In addition, the method of connecting the memory chips to the inner contacts includes wire bonding.

According to the aforementioned method of fabricating the memory card, the memory chips are stacked inside the cavity in the following steps. First, a memory chip is placed inside the cavity and then the memory chip is connected to some of the inner contacts. Thereafter, a molding process is carried out to encapsulate the memory chip and corresponding inner contacts with a molding compound. After that, another memory chip is disposed over the molding compound and the processes of electrically connecting the memory chip to some other the inner contacts and encapsulating the memory chip and corresponding inner contacts with molding compound are again performed. The aforementioned steps for stacking one memory chip over another are repeated until a memory chip stack having the desired number of memory chips is produced.

According to the aforementioned method of fabricating the memory card, memory chips are electrically connected to the inner contacts by wire bonding. Furthermore, the method of encapsulating the chips and the inner contacts includes performing a dispensing process. In addition, the ultra-thin plastic shell is formed in a mold injection process with the following steps. First, a mold and a vacuum pump are provided. The mold has an inner cavity linked to the vacuum pump. Thereafter, molding compound is injected into the mold cavity through an injection mechanism while the vacuum pump sucks out the gases inside the mold cavity.

The memory card of the present invention comprises a substrate having a cavity therein and an ultra-thin plastic shell so that a stack of memory chips can be enclosed in the same area inside the cavity to form a memory chip stack. Hence, the memory storage capacity of the memory card is increased. Furthermore, the process of fabricating the ultra-thin plastic card includes sucking air from the mold cavity with a vacuum pump. Therefore, a very thin plastic shell can be produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
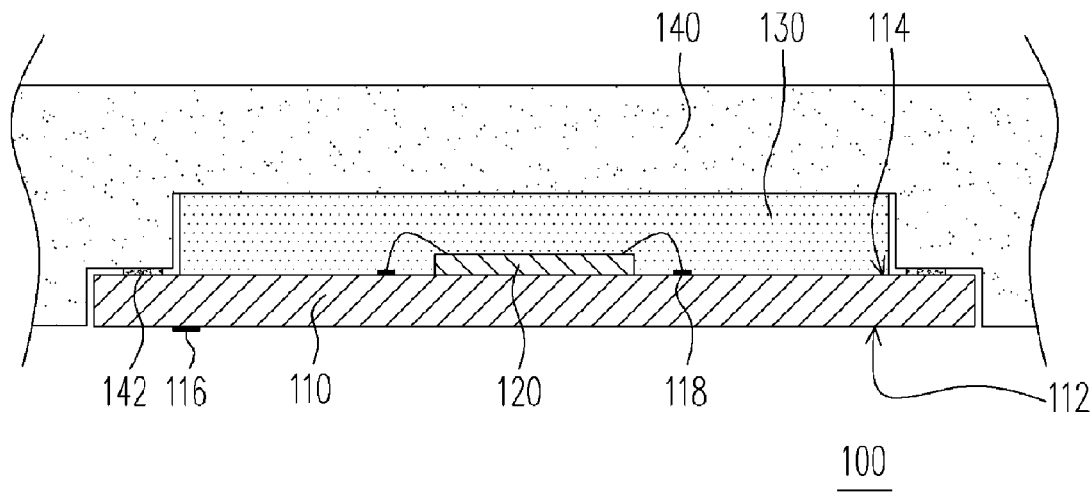
FIG. 1 is a schematic cross-sectional view showing the structure of a conventional memory card.

Reference will now be made in detail to the present preferred embodiments of the invention, examples of which are illustrated in the accompanying drawings. Wherever possible, the same reference numbers are used in the drawings and the description to refer to the same or like parts.

Figure 2:
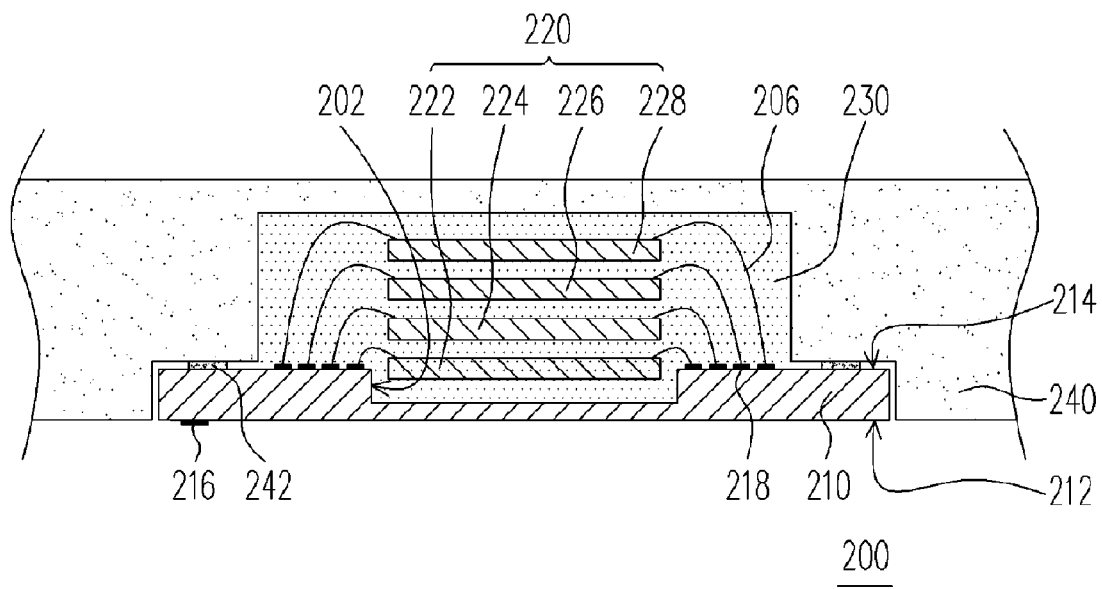
FIG. 2 is a schematic cross-sectional view showing the structure of a memory card according to one embodiment of the present invention.

FIG. 2 is a schematic cross-sectional view showing the structure of a memory card according to one embodiment of the present invention. As shown in FIG. 2, the memory card 200 comprises a substrate 210, a memory chip stack 220, some molding compound 230 and an ultra-thin plastic shell 240. The substrate 210 has a first surface 212 and a second surface 214 that are oppisite each other as shown in FIG 2. The first surface 212 has a plurality of outer contacts 216 and the second surface 214 has at least a cavity 202. A plurality of inner contacts 218 is formed around the cavity 202. The outer contacts 216 and the inner contacts 218 are electrically connected to each other. A plurality of memory chips 222, 224, 226 and 228 are stacked in the same area inside the cavity 202 to form the memory chip stack 220. Each of the memory chips within the stack 220 is electrically connected to corresponding inner contacts 218.

As shown in FIG. 2, the molding compound 230 encapsulates the memory chip stack 220 and the inner contacts 218. The ultra-thin plastic shell 240 covers the second surface 214 and has a thickness of about 0.1~0.4 mm in the area over the memory chip stack 220.

Figure 3A:
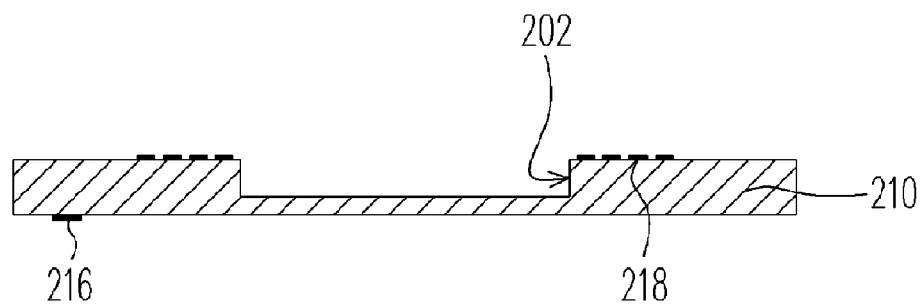
FIGS. 3A through 3E are schematic cross-sectional views showing the steps for fabricating a memory card according to one embodiment of the present invention.

FIGS. 3A through 3E are schematic cross-sectional views showing the steps for fabricating a memory card according to one embodiment of the present invention. As shown in FIG. 3A, a substrate 210 having a first surface 212 and a second surface 214 is provided. The first surface 212 has a plurality of outer contacts 216 for exchanging data with the outside world. The second surface 214 has at least a cavity 202. A plurality of inner contacts 218 is disposed around the cavity 202. The outer contacts 216 and the inner contacts 218 are electrically connected to each other through a series of patterned circuits (not shown) and blind vias (not shown).

Figure 3B:
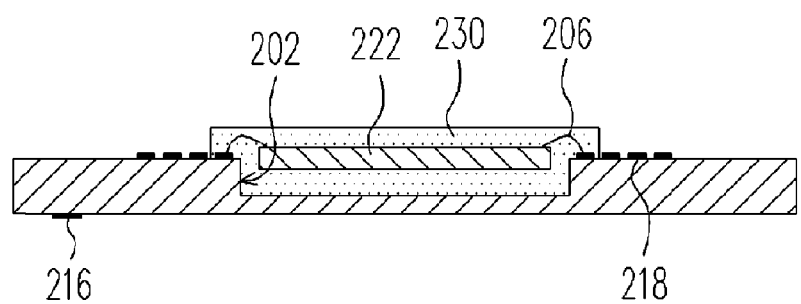

As shown in FIG. 3B, a first memory chip 222 is disposed inside the cavity 202. The memory chip 222 is electrically connected to some of the inner contacts 218 by wire bonding with conductive wires 206. The conductive wires 206 are fabricated using a conductive material having low electrical resistance such as gold or aluminum. Thereafter, a dispensing method or other packaging method is used to encapsulate the memory chip 222 and corresponding inner contacts 218 with a molding compound 230 (such as epoxy resin or polyimide).

Figure 3C:
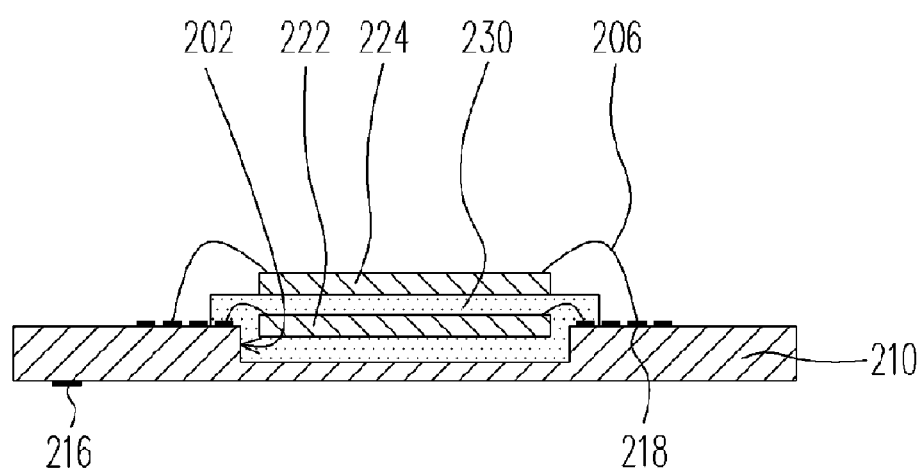

As shown in FIG. 3C, a second memory chip 224 is disposed over the molding compound 230. The second memory chip 224 is electrically connected to some other the inner contacts 218 by wire bonding with conductive wires 206.

Figure 3D:
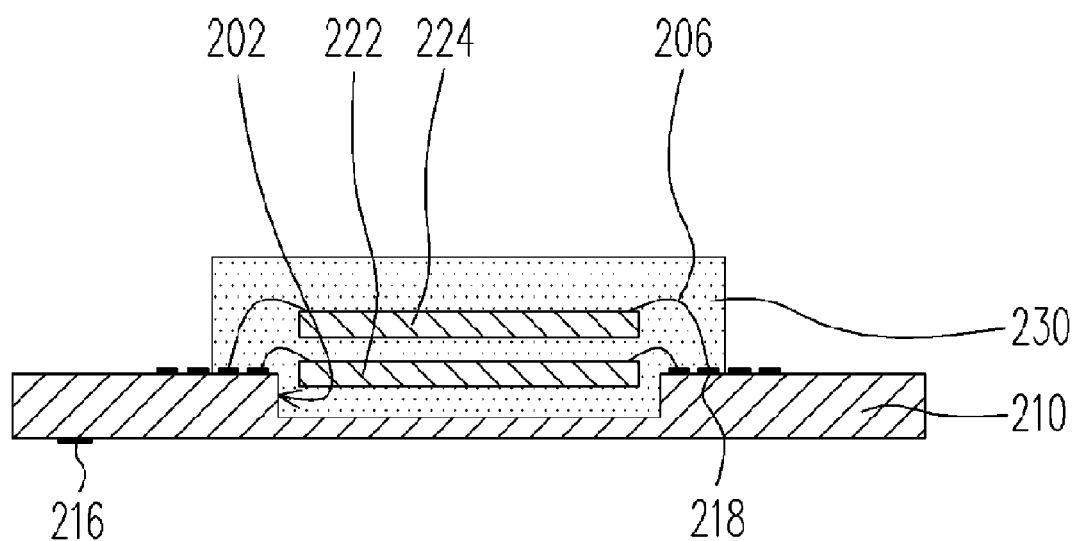
Figure 3E:
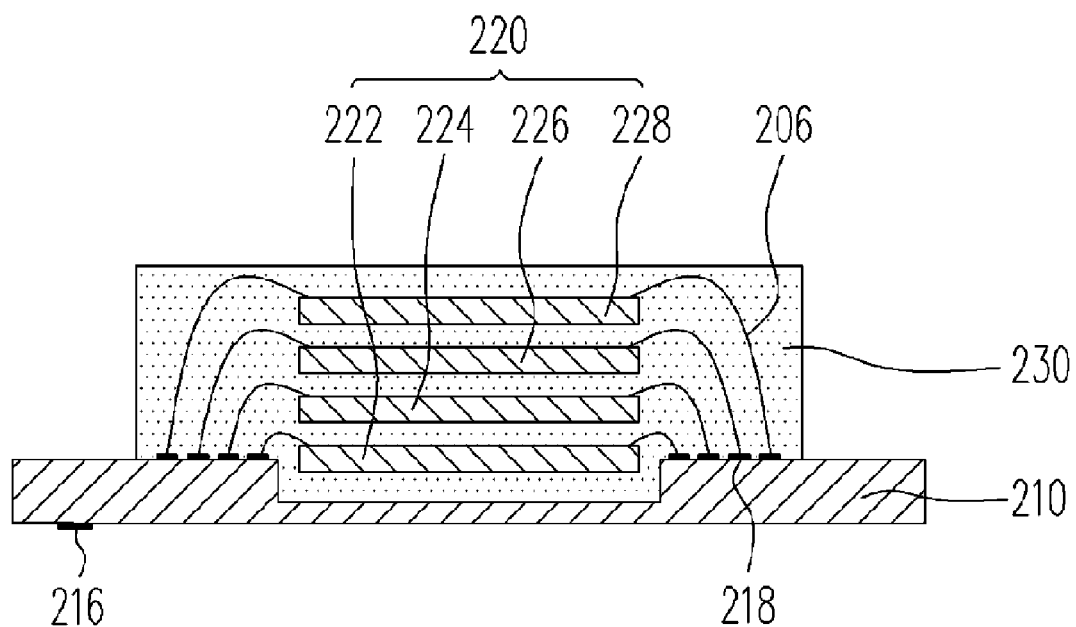

Thereafter, as shown in FIG. 3D, the steps in FIG. 3B is repeated to encapsulate the memory chip 224 and corresponding inner contacts 218 with a molding compound 230 using a dispensing method or other packaging method. As shown in FIG. 3E, the steps in FIG. 3C is repeated to stack two more memory chips 226 and 228 on top so that a memory chip stack 200 is formed. In the present embodiment, the total number of memory chips in the stack 220 is four.

A thermal plastic glue 242 is used to adhere the ultra-thin plastic shell 240 to the second surface 214 of the substrate 212 as shown in FIG. 2 to protect the inner components of the memory card 200. One major aspect of the ultra-thin plastic shell 240 is that the thickness in areas over the memory chip stack 220 is about 0.1~0.4 mm. The ultra-thin plastic shell 240 is fabricated from material including, for example, polycarbonate, polystyrene or acrylonitril butadiene styrene (ABS) resin.

In the end, the memory card has a body that meets the specifications of an xD picture card. However, the body or the memory card 200 in the present invention may be fabricated to meet the specifications of other memory devices including, for example, a Compact Flash memory Card (CF Card), Memory Stick Card (MS Card), Memory Stick Duo card (MS Duo Card), Multi Media Card (MMC), Reduced Size Multi Media Card (RS MMC), Mini Secure Digital card (Mini SD card), Secure Digital Card(SD Card), μ card, reduced size μ card and other mini memory cards with analogous functions.

Figure 4:
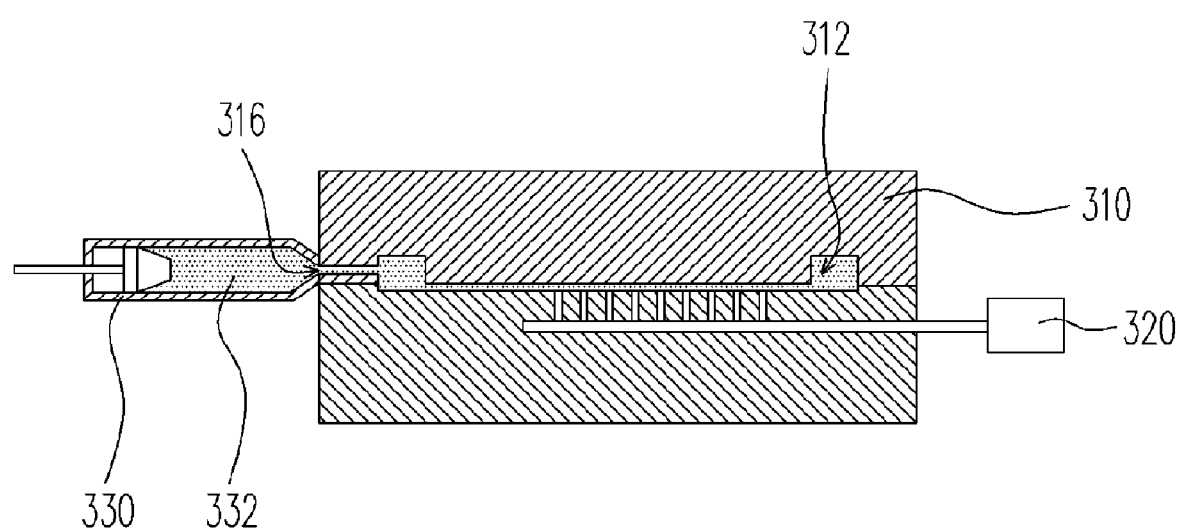
FIG. 4 is a schematic cross-sectional view showing the equipment for fabricating an ultra-thin plastic shell.

To fabricate the ultra-thin plastic shell 240, special equipment and method are used. FIG. 4 is a schematic cross-sectional view showing the equipment for fabricating an ultra-thin plastic shell. As shown in FIG. 4, the mold 310 has an internal cavity 312 having a shape that follows the contour of the ultra-thin plastic shell 240. In the process of fabricating the ultra-thin plastic shell 240, molding compound 332 is injected through a hole 316 into the mold cavity 312 using a mold injecting mechanism 330. Furthermore, a vacuum pump 320 connected to the mold cavity 312 continuously sucks air from the cavity 312 to reduce the pressure. Since the mold cavity 312 is maintained at a low pressure, the molding compound 332 can fill the entire cavity 312 uniformly. Ultimately, the ultra-thin plastic shell 240 has a thin body and a homogeneous makeup.

It should be noted that the ultra-thin plastic shell 240 is fabricated by injection molding. However, the ultra-thin plastic shell 240 can be fabricated by other mechanical means as well.

In summary, the memory card of the present invention comprises a substrate having a cavity therein and an ultra-thin plastic shell so that a stack of memory chips can be enclosed inside the cavity to increase the memory storage capacity of the memory card. In addition, the process of fabricating the ultra-thin plastic card includes sucking air from the mold cavity with a vacuum pump. Therefore, a very thin plastic shell can be produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory card structure, comprising:
   a substrate having a first surface and a second surface that are opposite each other, wherein the first surface has a plurality of outer contacts and the second surface has at least a cavity with a plurality of inner contacts disposed around it, and the outer contacts and the inner contacts are electrically connected to each other;
   a plurality of memory chips stacked in the same area inside the cavity to form a memory chip stack, wherein the memory chips are electrically connected to corresponding inner contacts;
   some molding compound encapsulating the memory chips and the inner contacts; and
   an ultra-thin plastic shell covering the second surface, wherein the area of the ultra-thin plastic shell over the memory chips has a thickness between about 0.1~0.4 mm.

2. The memory card structure of claim 1, wherein the ultra-thin plastic shell has a body that meets the specification of an xD picture card.

3. The memory card structure of claim 1, wherein the memory chips are connected to the inner contacts through a plurality of conductive wires.

4. The memory card structure of claim 3, wherein the conductive wires comprise gold or aluminum wires.

5. The memory card structure of claim 1, wherein each pair of neighboring memory chips is separated from each other through the molding compound.

6. The memory card structure of claim 1, wherein the material constituting the molding compound is selected from a group consisting of epoxy resin and polyimide.

7. The memory card structure of claim 1, wherein the material constituting the ultra-thin plastic shell is selected from a group consisting of polycarbonate, polystyrene and acrylonitril butadiene styrene (ABS) resin.

* * * * *